(12) United States Patent
Morikazu et al.

(10) Patent No.: US 7,754,582 B2
(45) Date of Patent: Jul. 13, 2010

(54) LASER PROCESSING METHOD

(75) Inventors: Hiroshi Morikazu, Ota-Ku (JP);
Shinichiro Uemura, Ota-ku (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 12/363,421

(22) Filed: Jan. 30, 2009

(65) Prior Publication Data
US 2009/0203193 A1   Aug. 13, 2009

(30) Foreign Application Priority Data
Feb. 8, 2008   (JP) ............... 2008-029084

(51) Int. Cl.
*H01L 21/00* (2006.01)
*H01L 21/30* (2006.01)
*H01L 21/46* (2006.01)

(52) U.S. Cl. ............ 438/460; 438/33; 438/68; 438/113; 438/455; 257/E21.214; 257/E21.517; 257/E21.532; 257/E21.599

(58) Field of Classification Search ........ 257/E21.599, 257/E21.517, E21.532, E21.214
See application file for complete search history.

(56) References Cited

U.S. PATENT DOCUMENTS

| | | | | |
|---|---|---|---|---|
| 7,179,723 B2 * | 2/2007 | Genda et al. | ........... | 438/462 |
| 7,399,682 B2 * | 7/2008 | Yoshikawa et al. | .......... | 438/463 |
| 7,622,366 B2 * | 11/2009 | Nakamura | ............... | 438/463 |
| 2004/0192012 A1 * | 9/2004 | Takezoe et al. | ............ | 438/460 |
| 2004/0226927 A1 * | 11/2004 | Morikazu et al. | ...... | 219/121.84 |
| 2005/0259459 A1 * | 11/2005 | Nagai et al. | ................ | 365/63 |
| 2006/0105546 A1 * | 5/2006 | Genda et al. | ............... | 438/463 |
| 2007/0190748 A1 * | 8/2007 | Nakamura | ............... | 438/460 |
| 2008/0227272 A1 * | 9/2008 | Nakamura | ............... | 438/462 |
| 2009/0124063 A1 * | 5/2009 | Nakamura | ............... | 438/463 |
| 2009/0170289 A1 * | 7/2009 | Furuta | ............ | 438/463 |

FOREIGN PATENT DOCUMENTS

JP    A 10-305420    11/1998

* cited by examiner

*Primary Examiner*—Charles D Garber
*Assistant Examiner*—Mohsen Ahmadi
(74) *Attorney, Agent, or Firm*—Greer, Burns & Crain, Ltd.

(57) ABSTRACT

A laser processing method including a first step of forming a first groove and a second step of forming a second groove on the workpiece. In the first step, the laser beam is intermittently applied to the first street except the intersections between the first street and the second street, thereby forming a discontinuous groove as the first groove in such a manner that each intersection is not grooved. In the second step, the laser beam is continuously applied to the second street, thereby forming a continuous groove as the second groove intersecting the first groove in such a manner that each intersection is grooved by the second groove. In the second step, heat generated at a portion immediately before each intersection is passed through the intersection to be dissipated forward, thereby suppressing overheating at this portion.

5 Claims, 7 Drawing Sheets

LASER PROCESSING METHOD

BACKGROUND OF THE INVENTION

1. Field of the Invention

The present invention relates to a laser processing method for forming a plurality of grooves in relation to a thin platelike workpiece such as a semiconductor wafer by applying a laser beam, and more particularly to a laser processing method suitable in the case that the grooves intersect each other.

2. Description of the Related Art

In a fabrication process for semiconductor devices (chips), a plurality of rectangular chip areas are partitioned by a plurality of crossing streets (division lines) formed on the front side of a substantially disk-shaped semiconductor wafer, and an electronic circuit such as IC or LSI is formed in each chip area. Thereafter, the back side of the wafer is ground as required and the wafer is next cut to be divided along all of the streets (dicing step) to obtain the individual chip areas as semiconductor chips. Each semiconductor chip thus obtained is packaged with a sealing resin and is widely used for various electric or electronic equipment such as a mobile phone or PC (personal computer).

As the dicing step for dividing the wafer into the individual semiconductor chips, blade dicing is generally known in the art, wherein a thin disk-shaped blade rotating at a high speed is cut into the wafer. It is known that the blade dicing has an advantage such that a flat and sharp cut surface can be obtained.

In recent years, laser dicing has also been adopted, wherein a transmissive laser beam is applied along each street to cut and divide the wafer. For example, Japanese Patent Laid-open No. Hei 10-305420 has proposed a technique of first applying a laser beam along each street on the front side of a wafer to form a plurality of grooves and next breaking (cleaving) the wafer along these grooves to obtain individual chips. The formation of the grooves along the streets of the wafer is effected by a thermal evaporation phenomenon called ablation such that the component of the wafer is heated and evaporated by a laser beam.

In performing the laser dicing, a plurality of grooves (first grooves) are first formed along all of the streets (first streets) extending in one direction as described in the above publication, and a plurality of second grooves are next formed along the second streets perpendicular to the first streets. Accordingly, the laser beam applied along the second streets is moved at right angles to the first grooves formed along the first streets. There is a case that a portion of each chip near the intersection of each first street and each second street is influenced by overheating at the front end of each second groove immediately before reaching each first groove.

The influence by overheating includes a deformation of each chip 3 shown in FIG. 7, wherein the width of the second groove G2 at a portion immediately before the first groove G1 extends so that the corners of the adjacent chips 3 on the opposite sides of the second groove G2 are not square, but round as shown in FIG. 7. The arrow shown in FIG. 7 denotes the direction of movement of the laser beam applied along each second street. Further, the round corners of each chip 3 become weak to cause a reduction in die strength, resulting in cracking or breakage in some case. Further, the influence by overheating also includes a reduction in easiness of a pickup operation such that each chip 3 is picked up after ending the dicing step.

The easiness of the pickup operation will now be described. In general, the wafer itself is hard to handle in the dicing step, and the wafer is therefore attached to a dicing tape to which a dicing frame is attached, thereby making the wafer handling easy. After ending the dicing step, each chip is peeled off from the dicing tape and picked up. In this case, the higher the peelability of each chip, the more easily each chip can be picked up. In this respect, a UV (ultraviolet) curing type adhesive material is used as the adhesive layer formed on the dicing tape, and ultraviolet light is applied to the dicing tape in picking up each chip, thereby reducing the adhesive strength of the adhesive material. As a result, each chip can be easily picked up.

However, in applying a laser beam along each second street after forming each first groove along each first street in the conventional dicing step, the portion of each second street immediately before reaching each first groove is overheated by the laser beam as mentioned above. Accordingly, the UV curing type adhesive material of the dicing tape at this portion is deteriorated by the overheating, causing a problem such that the adhesive strength of the adhesive material is not reduced in spite of the application of ultraviolet light. As a result, each chip is hard to peel off at this portion from the dicing tape in the pickup operation, thus reducing the easiness of the pickup operation. This problem occurs both in the formation of a groove having a depth smaller than the thickness of the wafer and in the formation of a slit cut through the thickness of the wafer. The deformation of each chip and a reduction in die strength of each chip as mentioned above occur more remarkably in the case of full cutting than in the case of groove formation.

SUMMARY OF THE INVENTION

It is therefore an object of the present invention to provide a laser processing method which can suppress the overheating at a portion immediately before the intersection of each first street and each second street in applying a laser beam along each second street to form each second groove intersecting each first groove previously formed, thereby preventing the problem caused by this overheating to obtain reliable products.

In accordance with an aspect of the present invention, there is provided a laser processing method for a workpiece having a plurality of first streets extending in a first direction and a plurality of second streets extending in a second direction intersecting the first direction, the laser processing method including the steps of holding the workpiece by using holding means; feeding the workpiece in the first direction and simultaneously applying a laser beam from laser beam applying means to the first streets except the intersections between the first streets and the second streets, thereby forming first grooves along the first streets; and feeding the workpiece in the second direction and simultaneously applying a laser beam from the laser beam applying means to the second streets, thereby forming second grooves along the second streets.

Each groove to be formed in relation to the workpiece includes not only a groove having a depth smaller than the thickness of the workpiece, but also a slit cut through the thickness of the workpiece. That is, each groove in the present invention includes a groove formed on the workpiece and a slit formed by full cutting of the workpiece. Further, the workpiece in the present invention is not limited to a wafer such as a semiconductor wafer as mentioned above, but includes a chip mounting adhesive member such as a DAF (Die Attach Film) provided on the back side of a wafer, a package for semiconductor products, a glass or silicon substrate, and various work materials required to ensure an accuracy on the order of micrometers.

According to the present invention, the first grooves are intermittently formed along the first streets except the intersections between the first streets and the second streets in the first groove forming step. Thereafter, in the second groove forming step, the laser beam is continuously applied along the second streets to thereby form the second grooves along the second streets in such a manner that the intersections not grooved by the first grooves are now grooved by the second grooves. Accordingly, when the laser beam is applied along the second streets to pass through the intersections, the first grooves discontinuous at the intersections are made continuous by the second grooves in such a manner that the first grooves and the second grooves intersect each other.

In the area of each second street immediately before the intersection between each first street and each second street, the distance from the focus of the laser beam to each first groove is short. In the related art, each first groove has already been formed at the intersection in forming each second groove, so that heat generated in this area in forming each second groove is hard to dissipate, causing easy overheating in this area. To the contrary, according to the present invention, each first groove is not formed at the intersection in the first groove forming step. Accordingly, heat generated in the area immediately before each intersection in the second groove forming step is passed through each intersection to be dissipated forward, thereby suppressing the overheating in this area to prevent the problem due to this overheating.

Thus, in forming each second groove intersecting each first groove by applying a laser beam, the overheating occurring immediately before each intersection can be suppressed. As a result, it is possible to prevent the problem including improper processing of the workpiece, a reduction in die strength of products, and a reduction in easiness of the pickup operation of products, thereby obtaining reliable products.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

A preferred embodiment of the present invention will now be described with reference to the drawings.

[1] Workpiece (Semiconductor Wafer)

Figure 1:
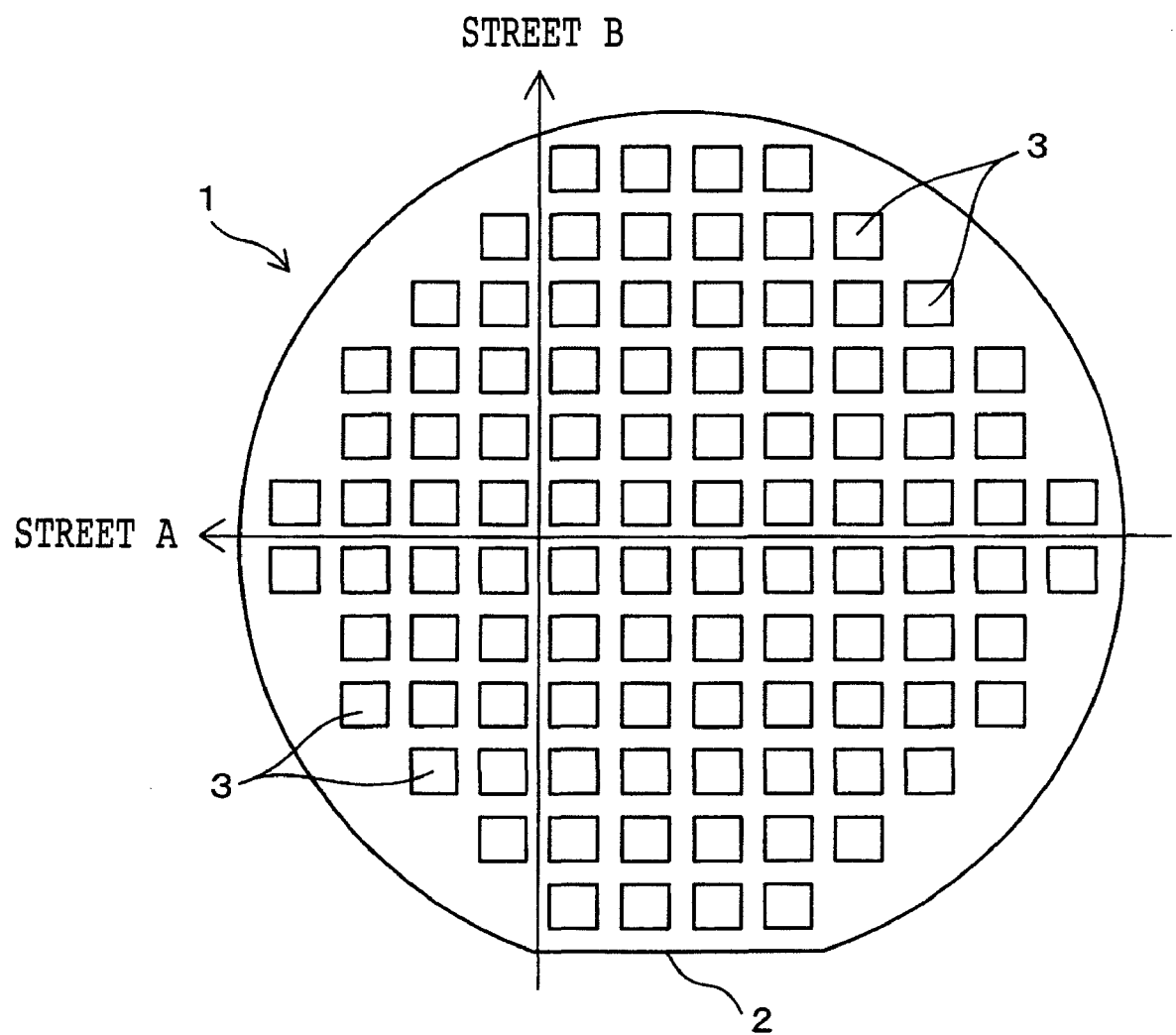
FIG. 1 is a plan view of a semiconductor wafer to be processed by a method according to a preferred embodiment of the present invention.

FIG. 1 shows a workpiece like a thin sheet as an object to be processed according to this preferred embodiment. This workpiece is a disk-shaped semiconductor wafer (which will be hereinafter referred to simply as wafer) such as a silicon wafer. For example, the wafer 1 has a thickness of about 200 μm and a diameter of about 200 mm. The outer circumferential portion of the wafer 1 is partially cut off to form an orientation flat 2 as a mark for indicating a crystal orientation.

The front side of the wafer 1 is formed with a plurality of first streets A extending in a first direction (horizontal direction as viewed in FIG. 1) and a plurality of second streets B extending in a second direction (vertical direction as viewed in FIG. 1) perpendicular to the first direction. The first streets A extend parallel to each other at equal intervals, and the second streets B also extend parallel to each other at equal intervals. Thus, the first and second streets A and B are arranged like a lattice.

A plurality of rectangular chips 3 are partitioned by these first and second streets A and B on the front side of the wafer 1. Although not shown, an electronic circuit such as IC or LSI is formed on the front side of each chip 3. After grinding the back side of the wafer 1 to reduce the thickness thereof as required, the wafer 1 is cut along all of the first and second streets A and B by dicing to obtain the individual chips 3. The cutting of the wafer 1 along the streets A and B may be performed by first forming grooves on the front side of the wafer 1 by applying a laser beam and next fully cutting the wafer 1 along all of the grooves by using a blade. Alternatively, the cutting of the wafer 1 along the streets A and B may be performed by fully cutting the wafer 1 only by the application of a laser beam. In this preferred embodiment, the wafer 1 is cut along the streets A and B by using a laser processing apparatus 10 shown in FIG. 3 to form the grooves.

Figure 2:
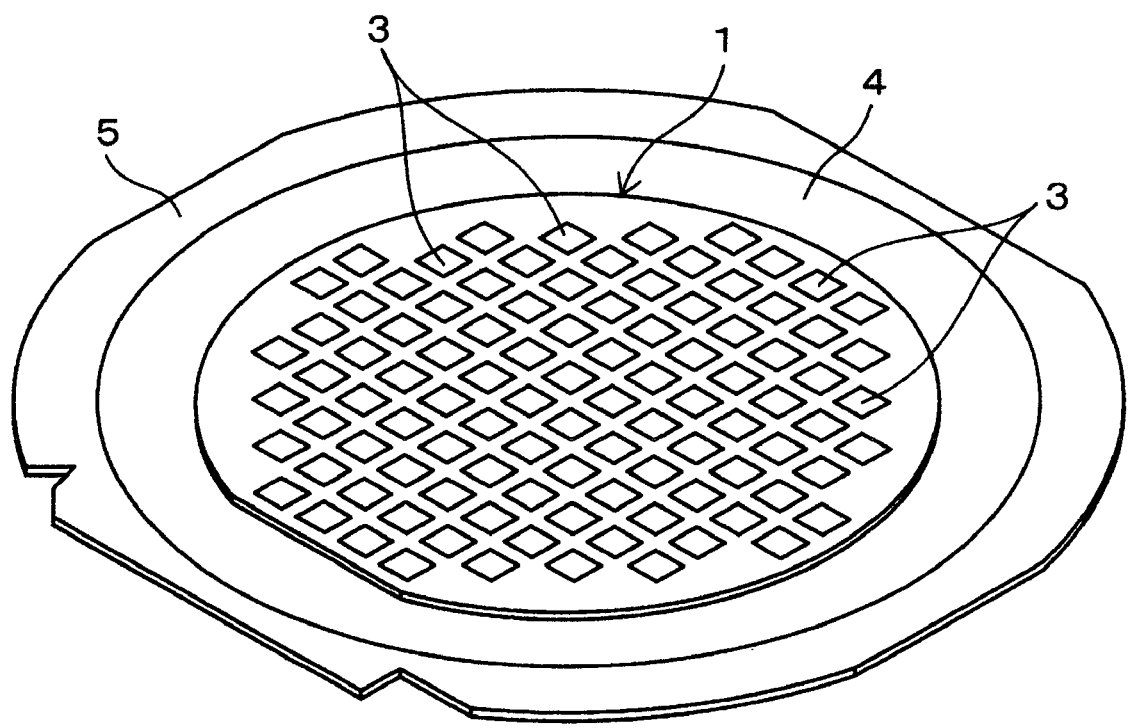
FIG. 2 is a perspective view of the semiconductor wafer shown in FIG. 1 in the condition where it is supported through a dicing tape to a dicing frame.

The laser processing apparatus 10 is configured so that the wafer 1 is horizontally set on a disk-shaped chuck table (holding means) 41 in the condition where the front side of the wafer 1 is oriented upward and that a laser beam is applied from a laser head 52 of laser beam applying means 50 along the streets A and B. In setting the wafer 1 on the chuck table 41, the wafer 1 is supported through a dicing tape 4 to a dicing frame 5 as shown in FIG. 2.

The dicing tape 4 is a circular adhesive tape composed of a base sheet having a thickness of about 100 μm and an adhesive layer having a thickness of about 5 μm formed on one side of the base sheet. The base sheet is formed of polyvinyl chloride, and the adhesive layer is formed of acrylic resin. The dicing frame 5 is an annular thin sheet member having an inner diameter larger than the diameter of the wafer 1. The dicing frame 5 is formed of a rigid material such as metal. The dicing frame 5 is attached to the outer circumferential portion of the adhesive surface (upper surface as viewed in FIG. 2) of the dicing tape 4. The back side of the wafer 1 is attached to the central portion of the adhesive surface of the dicing tape 4, so that the wafer 1 is supported through the dicing tape 4 to the dicing frame 5. The wafer 1 thus supported through the dicing tape 4 to the dicing frame 5 is transferred to the laser processing apparatus 10 by handling the dicing frame 5. The laser processing apparatus 10 will now be described in more detail with reference to FIG. 3.

[2] Laser Processing Apparatus

The laser processing apparatus 10 has a horizontal base 11 and an XY moving table 12 supported to the horizontal base 11 so as to be movable in an X direction shown by an arrow X and in a Y direction shown by an arrow Y. The chuck table 41 mentioned above is provided on the XY moving table 12. By moving the XY moving table 12 in the X direction and the Y direction, the laser beam applied from the laser head 52 can be relatively moved along the streets A and B of the wafer 1 held on the chuck table 4.

The XY moving table 12 is composed of an X-axis base 20 supported to the base 11 so as to be movable in the X direction and a Y-axis base 30 supported to the X-axis base 20 so as to be movable in the Y direction. The X-axis base 20 is slidably mounted on a pair of parallel guide rails 21 fixed to the base 11 and extending in the X direction. The X-axis base 20 is moved in the X direction by an X-axis driving mechanism 24 including a motor 22 and a ball screw 23 rotationally driven by the motor 22. On the other hand, the Y-axis base 30 is slidably mounted on a pair of parallel guide rails 31 fixed to the X-axis base 20 and extending in the Y direction. The Y-axis base 30 is moved in the Y direction by a Y-axis driving mechanism 34 including a motor 32 and a ball screw 33 rotationally driven by the motor 32.

A cylindrical chuck base 40 is fixed to the upper surface of the Y-axis base 30, and the chuck table 41 is supported to the chuck base 40 so as to be rotatable about an axis extending in a Z direction (vertical direction) shown by an arrow Z. The chuck table 41 is of a vacuum chuck type well known in the art. That is, the wafer 1 is held on the chuck table 20 by suction vacuum. The chuck table 41 is rotated in one direction or opposite directions by a rotational driving mechanism (not shown) provided in the chuck base 40. A pair of clamps 42 for detachably holding the dicing frame 5 is provided near the outer circumference of the chuck table 41 so as to be spaced 180° apart from each other. These clamps 42 are mounted on the chuck base 40.

The X direction in which the X-axis base 20 of the XY moving table 12 is moved corresponds to a feeding direction in which the laser beam is applied along the streets A or B. The Y direction in which the Y-axis base 30 of the XY moving table 12 is moved corresponds to an indexing direction in which any one of the streets A (B) to be applied by the laser beam is switched to the next adjacent street A (B). However, the Y direction may correspond to the feeding direction and the X direction may correspond to the indexing direction.

The laser beam applying means 50 will now be described. The laser beam applying means 50 has a rectangular parallelepiped casing 51 extending in the Y direction toward the upper side of the chuck table 41. The laser head 52 is provided at the front end of the casing 51. A column 13 is provided on the upper surface of the base 11, and the casing 51 is supported to the column 13 so as to be movable in the vertical direction (Z direction). That is, the casing 51 is vertically movable by a vertical driving mechanism (not shown) provided in the column 13.

Although not shown, a pulsed laser beam oscillator such as a YAG laser oscillator or a YVO4 laser oscillator is provided as a component of the laser beam applying means 50 in the casing 51. Also provided in the casing 51 is auxiliary equipment such as an output regulator for regulating the power (pulse energy) of the laser beam oscillated by the pulsed laser beam oscillator and a repetition frequency setting device. The laser head 52 includes a mirror for vertically downward directing the pulsed laser beam horizontally oscillated from the laser beam oscillator and a lens for focusing the laser beam reflected by the mirror. The control of the laser beam by the laser beam applying means 50 (e.g., on/off control and power control of the laser beam) is performed by control means 70.

Figure 3:
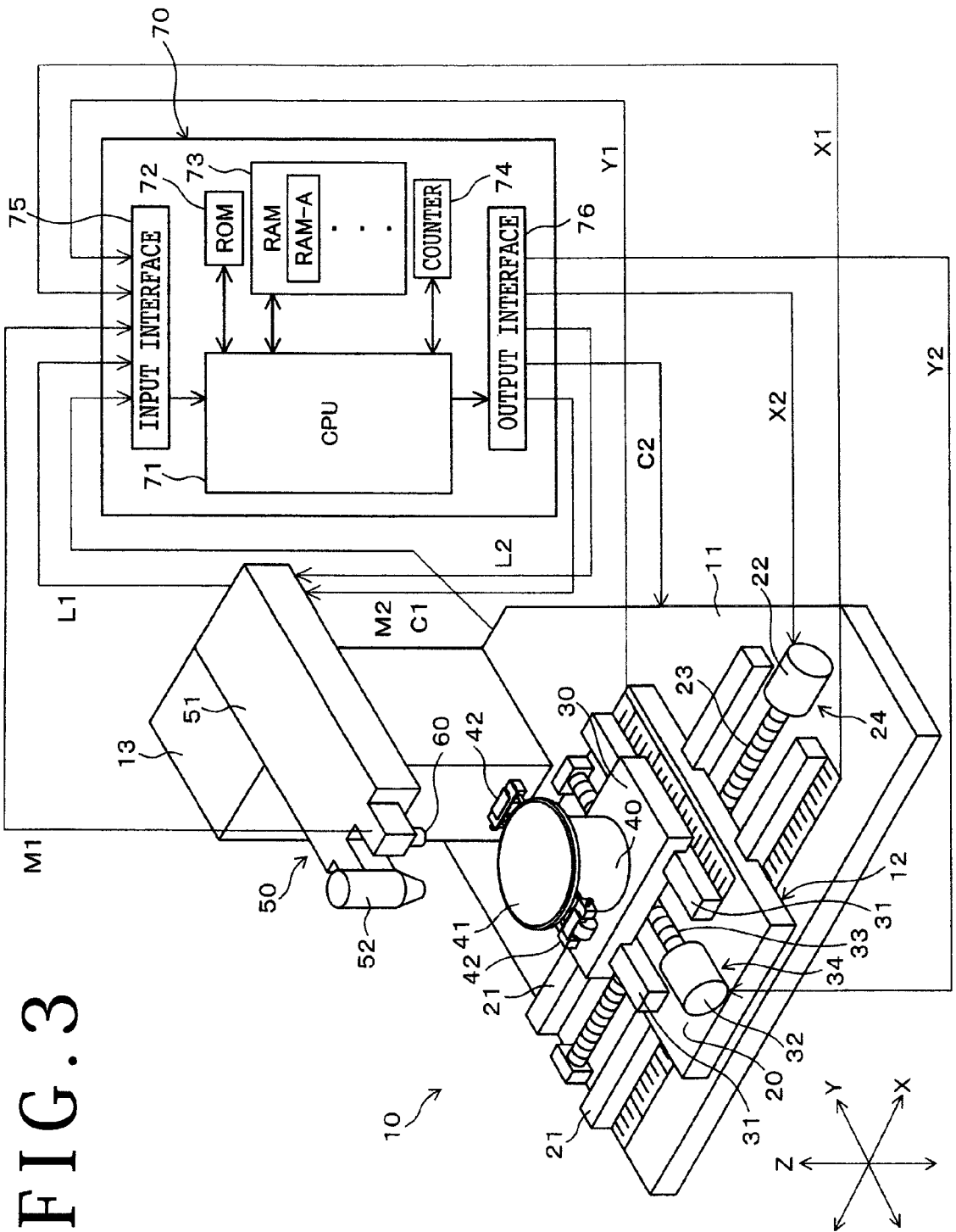
FIG. 3 is a perspective view showing a laser processing apparatus usable in performing the method according to this preferred embodiment.

As shown in FIG. 3, imaging means 60 is provided at the front end of the casing 51 so as to be juxtaposed to the laser head 52. The imaging means 60 functions to image and detect an applied area of the laser beam applied from the laser head 52. The imaging means 60 includes illuminating means for illuminating the workpiece (the wafer 1 in this preferred embodiment) set on the chuck table 41, an optical system, and an imaging device such as CCD for obtaining an image through the optical system. Image information obtained by the imaging means 60 is supplied to the control means 70.

The control means 70 is configured by a computer, and it includes a CPU (central processing unit) 71 for performing operational processing according a control program, a ROM (read only memory) 72 preliminarily storing the control program, a RAM (random access memory) 73 for storing the kinds of wafer, the results of computation or the like, a counter 74, an input interface 75, and an output interface 76.

Inputs through the input interface 75 into the CPU 71 of the control means 70 are feeding amount information X1 based on the positional information of the X-axis base 20, indexing amount information Y1 based on the positional information of the Y-axis base 30, rotational angle information C1 of the chuck table 41, laser beam application information L1 from the laser beam applying means 50, and image information M1 from the imaging means 60. Outputs from the CPU 71 through the output interface 76 are control signals X2, Y2, C2, L2, and M2 respectively to the motor 22 for moving the X-axis base 20, the motor 32 for moving the Y-axis base 30, a drive source such as a motor included in the rotational driving mechanism for the chuck table 41, the laser beam applying means 50, and the imaging means 60.

[3] Operation of the Laser Processing Apparatus and Groove Forming Method

A groove forming method based on the laser processing method of the present invention by the use of the laser processing apparatus 10 will now be described. The operation related to the groove formation is controlled by the control means 70. The wafer 1 supported through the dicing tape 4 to the dicing frame 5 as shown in FIG. 2 is concentrically placed on the chuck table 41 in the condition where the front side of the wafer 1 is oriented upward, and is held under suction vacuum. Further, the dicing frame 5 is held by the clamps 42.

Next, the XY moving table 12 is suitably moved in the X direction and the Y direction to thereby move the wafer 1 to a position directly below the imaging means 60. Thus, the wafer 1 is positioned so that the whole of the front side of the wafer 1 falls within the imaging area of the imaging means 60. The front side of the wafer 1 is imaged by the imaging means 60, and the control means 70 performs image processing such as pattern matching according to the image of the streets A and B on the front side of the wafer 1. Simultaneously, the control means 70 performs an alignment operation such that the chuck table 41 is rotated to make either the streets A or B to be first grooved (e.g., the first streets A in this preferred embodiment) parallel to the feeding direction (X direction). In concert with this alignment operation, the control means 70 recognizes the coordinate positions of the streets A and B in a coordinate system owned by the control means 70, creates operational data required for the groove formation, and stores the operational data created above. The control means 70 performs a first groove forming step and a second groove forming step to the wafer 1 in the following manner.

[3-1] First Groove Forming Step (Groove Formation Along the First Streets A)

The X-axis base 20 is moved in the X direction to thereby move the wafer 1 to a position deviated in the X direction from the focus of the laser beam applied from the laser head 52. Further, the Y-axis base 30 is moved in the indexing direction (Y direction) to thereby make the Y-directional position of one of the first streets A coincide with the focus of the laser beam, thus performing an indexing operation. Further, the casing 51 is suitably moved in the vertical direction to thereby vertically set the focus of the laser beam so that a groove having a predetermined depth is formed along this first street A. Thereafter, the X-axis base 20 is moved in the X direction to thereby move the wafer 1 toward the laser head 52 in the X direction. During this feeding operation, this first street A is passed through the focus of the laser beam applied from the laser head 52 with a fixed power. As a result, a first groove G1 having a predetermined depth is formed along this first street A.

Figure 4:
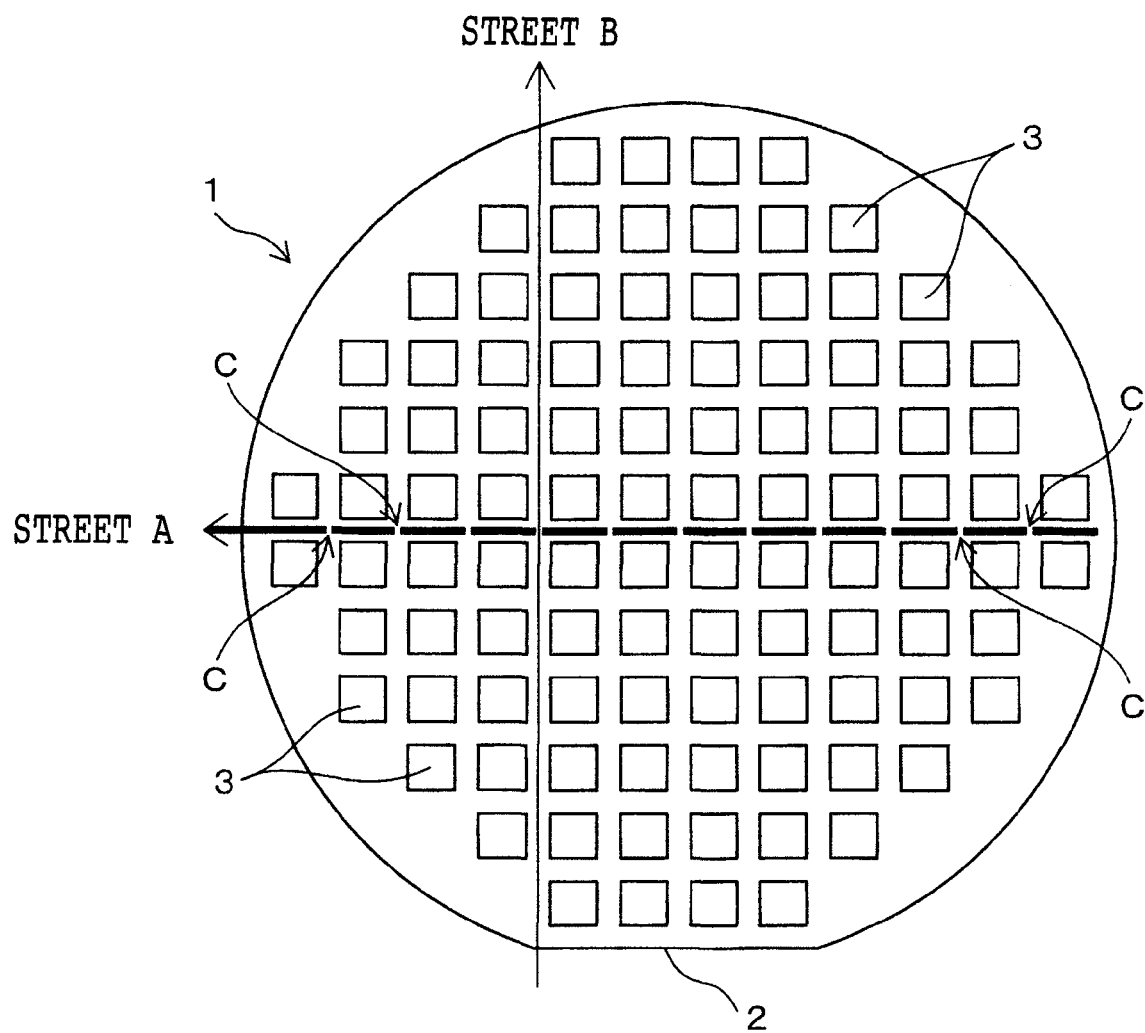
FIG. 4 is a plan view of the wafer in the condition where a laser beam is applied along a first street (first groove forming step)
Figure 5:
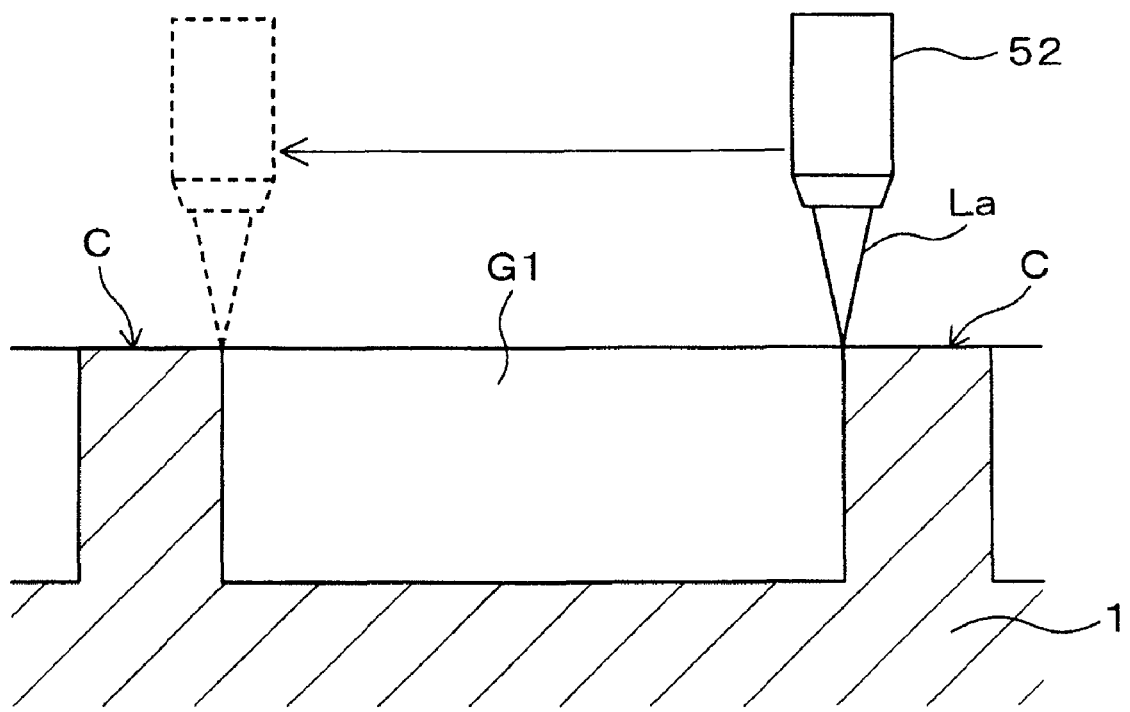
FIG. 5 is an enlarged sectional view showing the formation of a first groove along the first street.

In this preferred embodiment, the laser beam is not applied continuously over the length of this first street A, but it is applied discontinuously to this first street A except the intersections C with respect to all of the second streets B. Accordingly, as shown in FIGS. 4 and 5, the first groove G1 extending along this first street A is not formed at the intersections C between this first street A and all of the second streets B. FIG. 5 is a sectional view showing the formation of a part of the first groove G1 between the adjacent intersections C by the application of the laser beam La from the laser head 52. Such a discontinuous groove G1 can be formed by intermittently applying the laser beam during the feeding operation of the wafer 1 in such a manner that when each intersection C is passed through the focus of the laser beam, the application of the laser beam is stopped, whereas after each intersection C is passed through the focus of the laser beam, the application of the laser beam is restarted.

After the first groove G1 is discontinuously formed along this first street A, the Y-axis base 30 is moved in the indexing direction (Y direction) to make the Y-directional position of the next first street A adjacent to the previous first street A (along which the first groove G1 has been already formed) coincide with the focus of the laser beam. Thus, the indexing operation of the wafer 1 is performed. Thereafter, as feeding the wafer 1, the laser beam is intermittently applied to the next first street A in the same manner as that for the previous first street A, thereby forming a discontinuous first groove G1. Such a series of operation composed of the forward feeding operation, the indexing operation, and the backward feeding operation is repeated to zigzag move the wafer 1. During this zigzag movement of the wafer 1, the laser beam is applied intermittently along the other first streets A except the intersections C. Thus, the laser beam is applied intermittently along all of the first streets A to thereby form a plurality of first grooves G1 each discontinuous at the intersections C. The discontinuous part of each first groove G1 at each intersection C has a distance equal to or less than the width of each first groove G1. However, the larger the distance of this discontinuous part, the more the dissipation of heat can be improved.

[3-2] Second Groove Forming Step (Groove Formation Along the Second Streets B)

After finishing the formation of the discontinuous first grooves G1 along all of the first streets A, the chuck table 41 is rotated 90° to perform an alignment operation so that the second streets B become parallel to the X direction. Subsequently, a series of operations including a forward feeding operation, an indexing operation, and a backward feeding operation is repeated as in the first groove forming step to zigzag move the wafer 1. During this zigzag movement of the wafer 1, the laser beam is applied along all of the second streets B. In the second groove forming step, the laser beam is applied continuously along each second street B. That is, the laser beam is applied also to the intersections C between each second street B and all of the first streets A. As a result, a plurality of second grooves G2 are formed along all of the second streets B in such a manner as to connect the discontinuous parts of the first grooves G1 at the intersections C. Each second groove G2 has a width equal to that of each first groove G1. Accordingly, when the laser beam applied along each second street B is passed through the intersections C, the discontinuous first groove G1 extending along each first street A is made continuous by the continuous second groove G2 extending along each second street B in such a manner as to intersect the second groove G2 at right angles.

For example, the laser beam is applied to form the first and second grooves G1 and G2 under the following conditions.

| Light source | LD-excited Q-switched Nd: YVO4 |
|---|---|
| Wavelength | 355 nm |
| Repetition frequency | 50 kHz |
| Average power (pulse energy) | 8 W |
| Focused spot diameter | φ15 μm |
| Work feed speed | 200 mm/sec |

Each chip 3 has a square shape whose each side has a length of about 5 mm. Each of the grooves G1 and G2 has a width of about 25 μm and a depth of about 20 μm. Further, each discontinuous part of each groove G1 at each intersection C has a distance (width) of about 20 μm.

[4] Dicing Step

After finishing the second groove forming step by applying the laser beam along all of the second streets B, the groove formation on the wafer 1 is completed. Thereafter, the wafer 1 is fully cut along all of the first grooves G1 and the second grooves G2 by blade dicing, for example, thereby dividing the wafer 1 into the individual chips 3. In performing the blade dicing, the wafer 1 supported to the dicing frame 5 is removed from the chuck table 41 and next transferred to a blade dicing apparatus (not shown). After finishing the blade dicing, each chip 3 is peeled off from the dicing tape 4 and picked up by a pickup apparatus (not shown), thus obtaining the individual chips 3.

[5] Operation and Effect of this Preferred Embodiment

In the case that the first groove G1 extending along each first street A is continuous as in the related art, the distance from the focus of the laser beam to the first groove G1 becomes short in an area immediately before the intersection C in applying the laser beam along each second street B to form the second groove G2. As a result, heat is difficult to dissipate, causing an overheated condition. To the contrary, according to this preferred embodiment, in applying the laser beam along each first street A, the laser beam is not applied to the intersection C between each first street A and each second street B, so that the first groove G1 is not formed at the intersection C at this time. Accordingly, in applying the laser beam along each second street B after forming the discontinuous first groove G1, the heat generated in the area immediately before the intersection C is passed through the intersection C to dissipate forwardly of the focus of the laser beam. As a result, overheating in the area immediately before the intersection C can be prevented.

Figure 6:
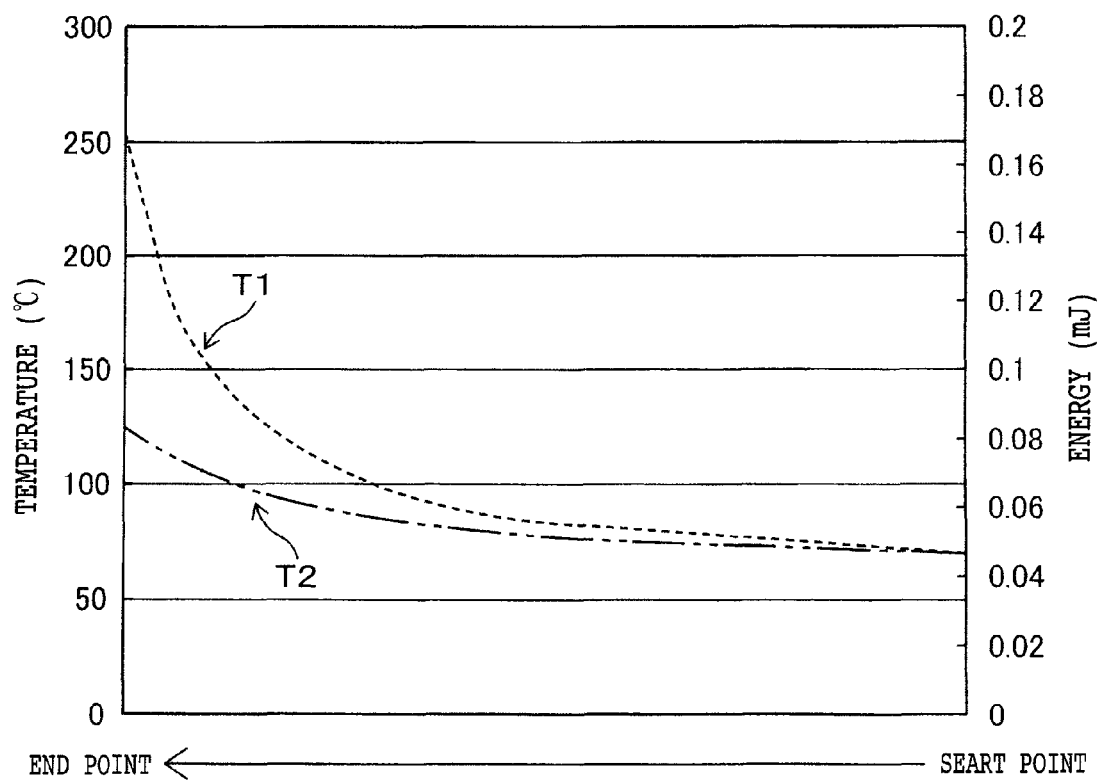
FIG. 6 is a graph showing a temperature change at the front end of a second groove before the intersection between the first street and the second street by the application of a laser beam, wherein T1 corresponds to the case where the first groove is formed at the intersection (related art) and T2 corresponds to the case where the first groove is not formed at the intersection (present invention)
Figure 7:
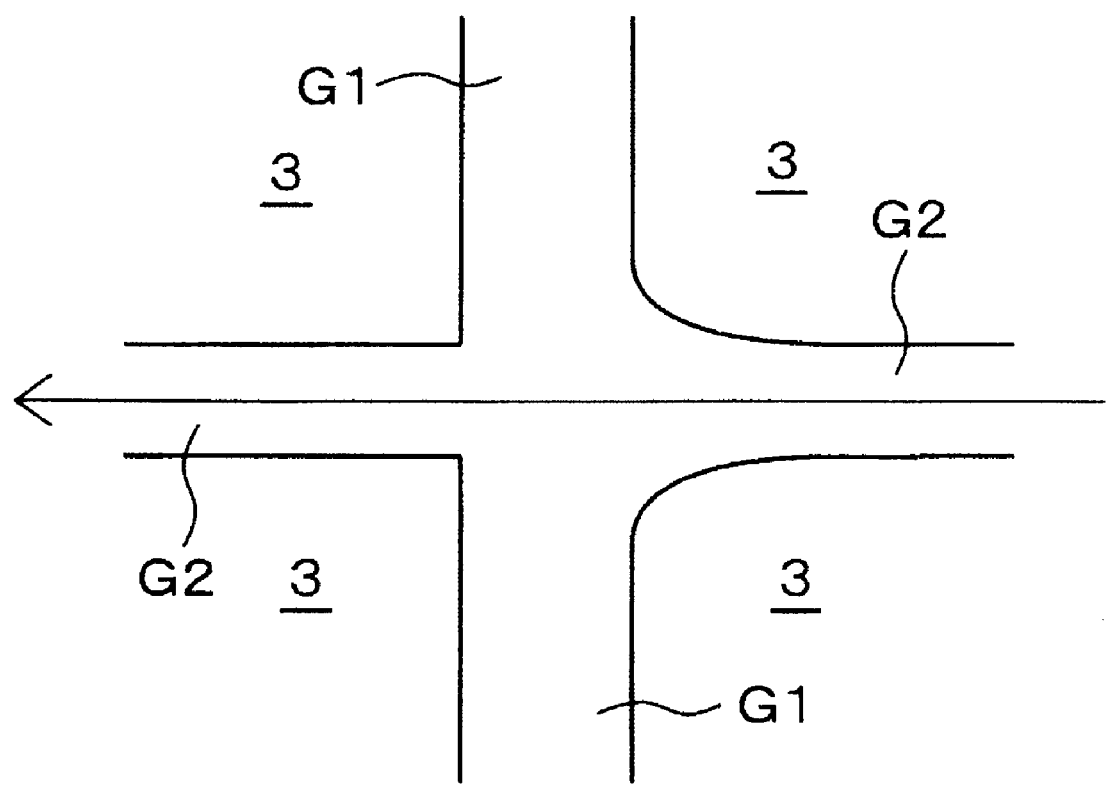
FIG. 7 is a plan view showing the condition of chips near the intersection between the first groove and the second groove formed by the prior art method (in which the first groove is continuously formed).

FIG. 6 is a graph showing a temperature change in applying the laser beam along each second street B as measuring the temperature of the front end of the second groove G2 forming one side of one of the chips 3. The direction of relative movement of the laser beam by the feeding operation of the wafer 1 is shown by an arrow pointed leftward as viewed in FIG. 6, wherein the start point for temperature measurement is set immediately after the focus of the laser beam is passed through any one of the first grooves G1 (any one of the first streets A), and the end point for temperature measurement is set immediately before the focus of the laser beam reaches the next adjacent first groove G1. In FIG. 6, reference symbol T1 denotes the temperature change in the case that each first groove G1 is continuous, and reference symbol T2 denotes the temperature change in the case that each first groove G1 is made discontinuous by not applying the laser beam at each intersection C according to the present invention. As apparent from FIG. 6, in the case that each first groove G1 is continuous, the temperature rapidly rises immediately before the end point (the curve T1), causing an overheated condition. In contrast, in the case that each first groove G1 is made discontinuous by not applying the laser beam at each intersection C, a rapid temperature rise is suppressed immediately before the end point (the curve T2), thereby suppressing the overheated condition.

Thus, the overheating immediately before the intersection C between each first groove G1 and each second groove G2 can be suppressed in applying the laser beam along each second street B, thereby preventing the problem due to this overheating. As mentioned above, this problem causes a deformation of each chip 3 due to an increase in width of each second groove G2 immediately before each intersection C. This problem also causes a reduction in die strength of each chip 3 to result in cracking or breakage. Such a deformation of each chip 3 and a reduction in die strength of each chip 3 occur more remarkably in the case of full cutting than in the case of groove formation. Accordingly, it can be said that the power control of the laser beam is especially effective in the case of full cutting.

In the case that the dicing tape 4 uses a UV curing type adhesive material, UV light is applied to this adhesive material in picking up each chip 3 from the dicing tape 4, thereby reducing the adhesive strength of the dicing tape 4 to facilitate the peeling-off of each chip 3 from the dicing tape 4. The UV curing type adhesive material is deteriorated when it is overheated, so that the adhesive strength of the dicing tape 4 is not reduced in spite of the application of UV light. However, according to this preferred embodiment, overheating occurring near each intersection C in the related art can be suppressed to thereby avoid a deterioration of the adhesive material of the dicing tape 4. Accordingly, each chip 3 can be smoothly peeled off from the dicing tape 4. Thus, it is possible to ensure the easiness of the pickup operation of each chip 3 by the use of the UV curing type adhesive material.

The groove formation by the application of a laser beam according to the present invention includes not only the formation of a groove having a depth smaller than the thickness of the wafer, but also the formation of a slit cut through the thickness of the wafer. While the semiconductor wafer 1 is used as a workpiece in this preferred embodiment, the workpiece applicable in the present invention is not limited to a semiconductor wafer, but includes a chip mounting adhesive member such as a DAF (Die Attach Film) provided on the back side of a semiconductor wafer, a package of semiconductor products, a glass or silicon substrate, and various work materials required to ensure an accuracy on the order of micrometers.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A laser processing method for a workpiece having a plurality of first streets extending in a first direction and a plurality of second streets extending in a second direction intersecting said first direction, said laser processing method comprising the steps of:

holding said workpiece by using holding means;

feeding said workpiece in said first direction and simultaneously applying a laser beam from laser beam applying means to said first streets except the intersections between said first streets and said second streets so that application of the laser beam is halted while each of the intersections between the first streets and the second streets is fed through a focus point of the laser beam, for forming first grooves along said first streets, said first grooves including gaps at the intersections, each gap having a length less than or equal to a width of one of the first grooves; and then, after forming said first grooves, feeding said workpiece in said second direction and simultaneously applying a laser beam from said laser beam applying means to said second streets, for forming second grooves along said second streets, said second grooves each having a width substantially equal to the width of one of the first grooves and passing through the intersections between the first streets and the second streets to remove the gaps.

2. The method of claim 1, wherein said laser beam applying means applies a laser beam having a wavelength of about 355 nm.

3. The method of claim 1, wherein said laser beam applying means applies a laser beam having an average power of about 8 W.

4. The method of claim 1, wherein said laser beam applying means applies a laser beam having a repetition frequency of about 50 kHz.

5. The method of claim 1, wherein said laser beam applying means applies a laser beam having a focused spot diameter of about 15 μm.

* * * * *